United States Patent
Barile et al.

(10) Patent No.: US 11,292,029 B2
(45) Date of Patent: Apr. 5, 2022

(54) DYNAMIC GLASS AND METHOD OF FORMATION

(71) Applicant: The Board of Trustees of the Leland Stanford Junior University, Stanford, CA (US)

(72) Inventors: Christopher J. Barile, Reno, NV (US); Daniel J. Slotcavage, Menlo Park, CA (US); Michael David McGehee, Palo Alto, CA (US); Tyler S. Hernandez, Stanford, CA (US); Michael T. Strand, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/629,201

(22) PCT Filed: Jul. 19, 2018

(86) PCT No.: PCT/US2018/042921
§ 371 (c)(1),
(2) Date: Jan. 7, 2020

(87) PCT Pub. No.: WO2019/018667
PCT Pub. Date: Jan. 24, 2019

(65) Prior Publication Data
US 2020/0142273 A1 May 7, 2020

Related U.S. Application Data

(60) Provisional application No. 62/534,918, filed on Jul. 20, 2017.

(51) Int. Cl.
*B05D 5/12* (2006.01)
*C03C 4/14* (2006.01)
(Continued)

(52) U.S. Cl.
CPC ............. *B05D 5/12* (2013.01); *B05D 7/56* (2013.01); *C03C 4/14* (2013.01); *C03C 17/3671* (2013.01);
(Continued)

(58) Field of Classification Search
None
See application file for complete search history.

(56) References Cited

U.S. PATENT DOCUMENTS

| 5,903,382 A | 5/1999 | Tench et al. |
| 5,923,456 A | 7/1999 | Tench et al. |

(Continued)

OTHER PUBLICATIONS

Autnorized Officer: Blaine R. Copenheaver, International Search Report and Written Opinion issued in counterpart PCT application No. PCT/US2018/042921, dated Oct. 3, 2018, 9 pp.

*Primary Examiner* — Shamim Ahmed
*Assistant Examiner* — Bradford M Gates
(74) *Attorney, Agent, or Firm* — Kaplan Breyer Schwarz, LLP

(57) ABSTRACT

The present disclosure enables high contrast, fast, uniform, and color-neutral dynamic-glass elements based on uniform and reversible electrodeposition of metals a surface of the element. Elements in accordance with the present disclosure include a surface-modified transparent-conductor-based window electrode, wherein the surface modification of the window electrode includes a nucleation layer that is anchored to the transparent conductor via a non-metallic adhesion layer. In some embodiments, a plurality of traces is disposed on and electrically connected to the window electrode to reduce the voltage drop across the total area of the element, where the traces have a core made of a low-resistivity material.

10 Claims, 8 Drawing Sheets

(51) Int. Cl.
*G02F 1/1506* (2019.01)
*G02F 1/155* (2006.01)
*G02F 1/1523* (2019.01)
*G02F 1/1524* (2019.01)
*C03C 17/36* (2006.01)
*C23C 16/455* (2006.01)
*B05D 7/00* (2006.01)

(52) U.S. Cl.
CPC .... *C03C 17/3697* (2013.01); *C23C 16/45525* (2013.01); *C23C 16/45555* (2013.01); *G02F 1/155* (2013.01); *G02F 1/1506* (2013.01); *G02F 1/1523* (2013.01); *G02F 1/1524* (2019.01); *B05D 2203/35* (2013.01); *G02F 2001/1552* (2013.01); *G02F 2001/1555* (2013.01)

(56) References Cited

U.S. PATENT DOCUMENTS

| | | |
|---|---|---|
| 6,111,685 A | 8/2000 | Tench et al. |
| 6,166,847 A | 12/2000 | Tench et al. |
| 6,256,135 B1 | 7/2001 | Tench et al. |
| 6,301,039 B1 | 10/2001 | Tench |
| 6,400,491 B1 | 6/2002 | Tench et al. |
| 6,552,843 B1 | 4/2003 | Tench et al. |
| 6,721,080 B1 | 4/2004 | Tench et al. |
| 6,740,580 B1 | 5/2004 | Gupta et al. |
| 6,798,556 B2 | 9/2004 | Tench et al. |
| 7,022,210 B2 | 4/2006 | Tench |
| 7,317,566 B2 | 1/2008 | Tench et al. |
| 2005/0248825 A1 | 11/2005 | Warren, Jr. et al. |
| 2014/0338728 A1 | 11/2014 | Cheyns |
| 2014/0356524 A1 | 12/2014 | Gao et al. |
| 2017/0098508 A1* | 4/2017 | Kamath ............ H01G 4/01 |

* cited by examiner

Before → After

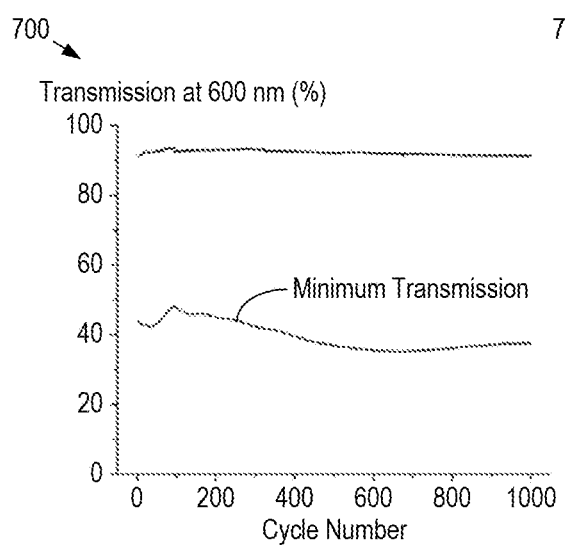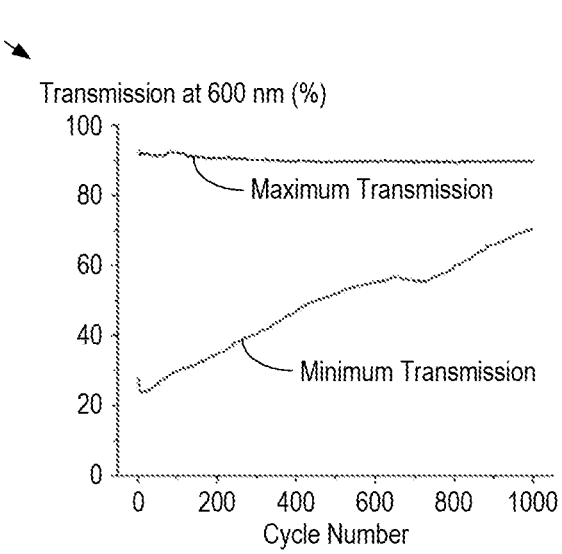
FIG. 7A
FIG. 7B

DYNAMIC GLASS AND METHOD OF FORMATION

CROSS REFERENCE TO RELATED APPLICATIONS

This application claims the benefit of U.S. Provisional Application Ser. No. 62/534,918, filed Jul. 20, 2017, entitled "Dynamic Glass", which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

TECHNICAL FIELD

The present disclosure relates to optics in general, and, more particularly, to devices having a controlled optical transmissivity.

BACKGROUND

Glass having electronically controllable transmissivity, often referred to as "dynamic" or "smart" glass, is attractive for use in many applications. For example, dynamic-glass windows offer substantially decreased energy consumption in buildings by controlling the amount of sunlight through them, which enables more efficient use of heating and cooling infrastructure. In addition, dynamic mirrors are widely used in side- and rear-view mirrors in many cars to automatically attenuate the glare associated with the headlights of trailing vehicles. Additional applications for smart glass include controllable sunglasses, dynamic vehicle sunroofs, and the like.

Unfortunately, conventional dynamic glass has been commercialized on only a small scale due to problems associated with durability, color, switching speed, and cost. Most dynamic glass utilizes electrochromic materials, which change their transmission properties upon application of a voltage. The vast majority of research on dynamic glass over the past four decades has focused on transition metal oxides or polymeric materials as electrochromic materials. The most dominant conventional technologies to date include suspended-particle devices, polymer-dispersed liquid crystal devices, and electrochromic devices.

Suspended-particle devices are attractive for use in automotive applications because they can have switching times on the order of a few seconds. Unfortunately, they are extremely expensive, are hazy and require power when in their clear state, and are characterized by a blue color (i.e., they are not color neutral).

Polymer-dispersed liquid crystal devices also have fast switching times; however, they have poor contrast and are also hazy. Furthermore, polymer-dispersed liquid crystal devices require power when in their clear state and, as a result, are characterized by high power dissipation.

Electrochromic devices have been employed in building windows for decades, have low haze, and good contrast ratio. Unfortunately, they change states very slowly (of order several minutes), have mediocre infrared performance, and often require toxic materials.

More recently, the development of reversible electrodeposition of metals on transparent conducting electrodes offers the promise of overcoming some of the disadvantages of other prior-art approaches. In such devices, an electrolyte containing metal ions is disposed between a pair of electrodes on which atoms of the same metal reside. In response to a voltage applied to the electrodes, metal dissolves from one electrode and deposits on the other. By reversing the polarity of the voltage, the direction in which the metal migration occurs is reversed.

Unfortunately, prior-art reversible-metal-electrodeposition devices have several disadvantages. For example, the electrolytes employed require high deposition overpotentials due to increased ion pairing in their solvents. In addition, the robustness of their electrodes is typically poor, leading to poor lifetimes and a need to steadily increase the applied voltage to obtain the same level of transmissivities through multiple cycles. Furthermore, the size of the devices is limited due to poor deposition uniformity over large areas. Still further, high-contrast and neutral color response have been difficult to achieve. Finally, irising gives rise to non-uniformity of response over the area of the devices.

The need for a volume-manufacturable dynamic glass having high contrast, good uniformity, fast response time, low cost, and long lifetime remains, as yet, unmet by prior-art approaches.

SUMMARY

The present disclosure enables dynamic glass devices without some of the costs and disadvantages of the prior art. Embodiments in accordance with the present disclosure have high contrast, fast switching speed, and excellent uniformity across their window area. They are also color neutral and are compatible with low-cost, high-volume manufacturing methods.

Embodiments in accordance with the present disclosure include robust dynamic glass elements that possess neutral color, high contrast, and excellent durability based on uniform and reversible electrodeposition of metals.

Like the prior art, dynamic glass elements in accordance with the present disclosure include a window electrode having a transparent conductor whose surface is modified with the addition of a nucleation layer. In prior-art approaches, this nucleation layer is anchored to the transparent conductor via an intervening vacuum-deposited metallic layer that promotes its adhesion.

In sharp contrast to the prior art, structures in accordance with the present disclosure employ non-metallic adhesion layers that can be formed without the need for vacuum deposition. Methods for forming such non-metallic adhesion layers include immersion in liquid baths, spray coating, and the like, which are significantly less expensive and complex than vacuum deposition methods, and also enable larger windows with less complex fabrication required.

An illustrative embodiment is a dynamic-glass element that comprises a transparent window electrode disposed on a first transparent substrate, a counter electrode disposed on a second transparent substrate, and an aqueous electrolyte that resides between the substrates. The window electrode includes a transparent conductor that is modified such that its surface facilitates nucleation of metal ions from the electrolyte onto the window electrode. The modification of the window electrode includes a nucleation layer that is anchored to the transparent conductor via an organic adhesion layer.

In the illustrative embodiment, the transparent conductor comprises indium tin oxide (ITO), the nucleation layer comprises platinum (Pt) nanoparticles, and the adhesion layer is a self-assembled monolayer (SAM) of 3-mercaptopropionic acid.

In some embodiments, the transparent conductor comprises a material other than ITO, such as a different conducting oxide (e.g., fluorine-doped tin oxide (PTO), doped zinc oxide (ZnO), etc.), a conducting polymer (e.g., poly(3,4-ethylenedioxythiophene) (PEDOT), Poly(4,4-dioctyl cyclopentadithiophene), etc.), carbon nanotubes, and the like.

In some embodiments, the nucleation layer includes a material other than Pt nanoparticles.

In some embodiments, the adhesion layer comprises a non-metallic material other than a 3-mercaptopropionic acid, such as non-metallic self-assembled monolayers, other mercapto-organic acids, silanes, thiols, phosphoric acids, phosphonic acids, amino acids, etc.

In some embodiments, the high-electrical-conductivity paths collectively define a grid disposed on the window electrode. In some embodiments, at least one of the high-electrical-conductivity paths comprises a core of a first material having relatively higher electrical conductivity and an outer shell of a second material having a relatively lower electrical conductivity and that is more resistant to electrochemical and chemical attack by the electrolyte than the first material. In some embodiments, the first material comprises a conventional metal conductor, such as copper, nickel, aluminum, gold, etc., while the second material comprises a more noble metal (e.g., platinum, etc.) or a semiconductor (e.g., titanium nitride, aluminum nitride, etc.). In some embodiments, the high-electrical-conductivity paths comprise a three-layer material system in which the outer layer comprises the same metal that is electrodeposited during operation of the device.

An embodiment in accordance with the present disclosure is a dynamic-glass element (100) comprising: a first electrode (104) that includes a first layer (116), a transparent conductor (112), and a non-metallic adhesion layer (114) that is operative for adhering to each of the first layer and the transparent conductor; a second electrode (106); and an electrolyte (108) that is located between the first and second electrodes.

Another embodiment in accordance with the present disclosure is a method for forming dynamic-glass element (100) comprising a first electrode (104) disposed on a first substrate (102-1), a second electrode (106) disposed on a second substrate (102-2), and an electrolyte (108) that is located between the first and second electrodes, wherein the first electrode is formed by operations of a method comprising: enabling first contact between a first liquid (402) and a first surface (122) of a first layer (112) of a first material, the first layer being disposed on the first substrate, wherein the first liquid comprises a non-metallic solution, wherein the first contact gives rise to a second layer (114) disposed on the first surface, the second layer being non-metallic; and enabling second contact between the second layer and a second liquid (404) containing a plurality of nanoparticles comprising a second material, wherein the second contact gives rise to a third layer (116) disposed on the second layer.

BRIEF DESCRIPTION OF THE DRAWINGS

FIGS. 7A-B depict maximum and minimum transmissions for dynamic-glass-based windows having platinum-modified and non-platinum-modified window electrodes, respectively.

DETAILED DESCRIPTION

Figure 1:
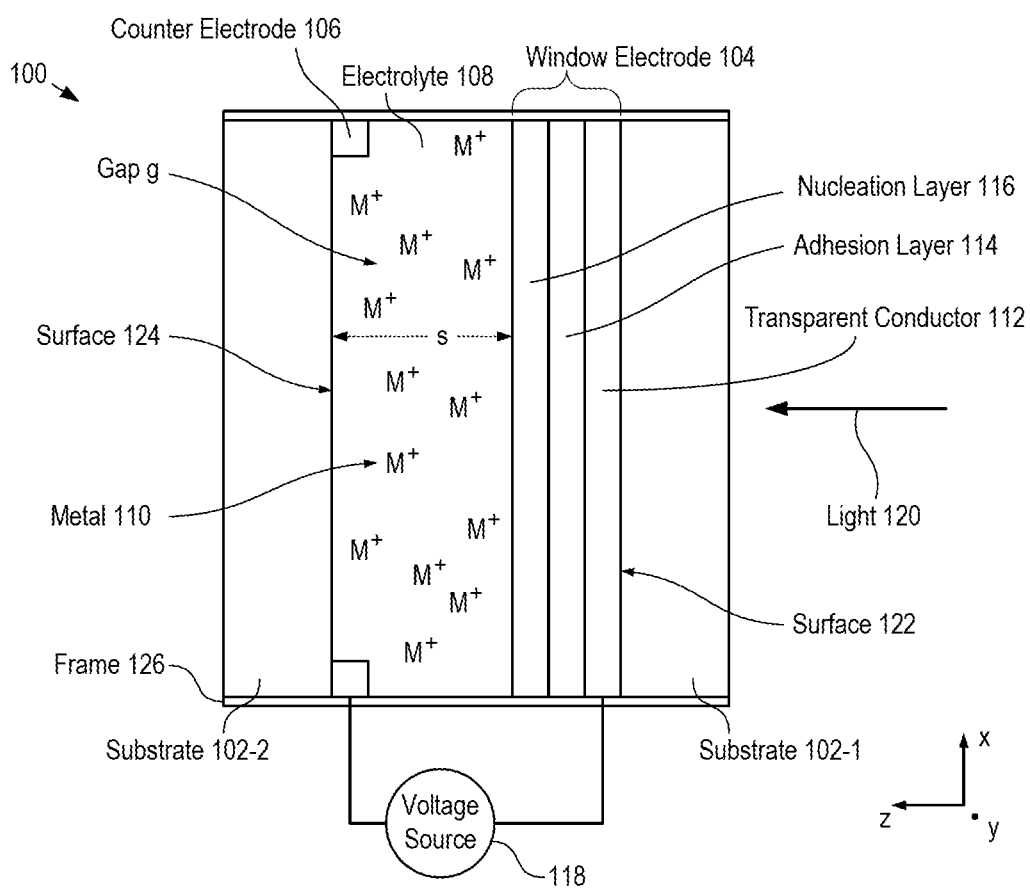
FIG. 1 depicts a schematic drawing of a cross-sectional view of a dynamic-glass window in accordance with an illustrative embodiment in accordance with the present disclosure.

FIG. 1 depicts a schematic drawing of a cross-sectional view of a dynamic-glass window in accordance with an illustrative embodiment in accordance with the present disclosure. Window 100 comprises substrates 102-1-1 and 102-1-2, window electrode 102-2, counter electrode 104, and electrolyte 106.

Figure 2:
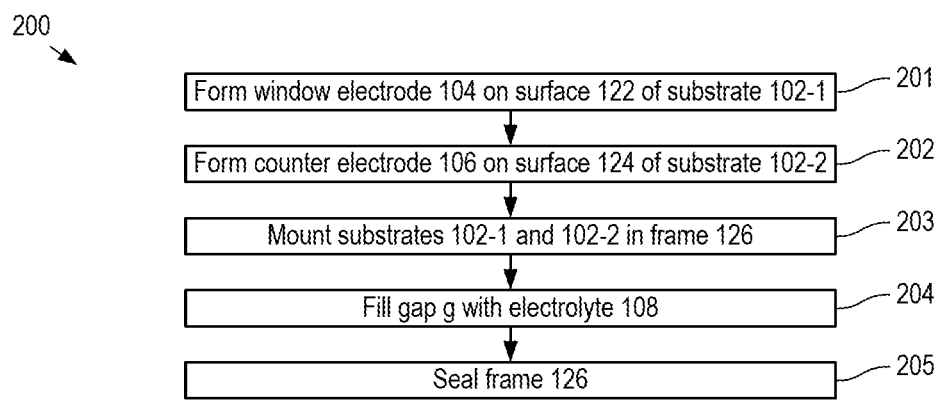
FIG. 2 depicts operations of a method suitable for forming a dynamic glass window in accordance with the illustrative embodiment.

FIG. 2 depicts operations of a method suitable for forming a dynamic glass window in accordance with the illustrative embodiment. Method 200 begins with operation 201, wherein window electrode 104 is formed on substrate 102-1. Method 200 is described herein with continuing reference to FIG. 1, as well as reference to FIGS. 2-4.

Substrate 102-1 is a substantially mechanically rigid substrate comprising a material that is substantially transparent for light 120. In the illustrative embodiment, substrate 102-1 is a conventional glass substrate and light 120 is visible light. In some embodiments, substrate 102-1 is a flexible substrate comprising a material that is transparent for light 120, such as polyethylene terephthalate (PET), polyester, other plastics, etc. In some embodiments, light 120 is an electromagnetic radiation other than visible light and substrate 102-1 comprises a different rigid or flexible material.

Window electrode 104 is disposed on the interior surface of substrate 102-1 such that it is in contact with electrolyte 108 when window 100 is fully assembled. Window electrode 104 is substantially transparent for light 120. In the depicted example, window electrode 104 is a multi-layer material stack that comprises transparent conductor 112, adhesion layer 114, and nucleation layer 116.

Figure 3:
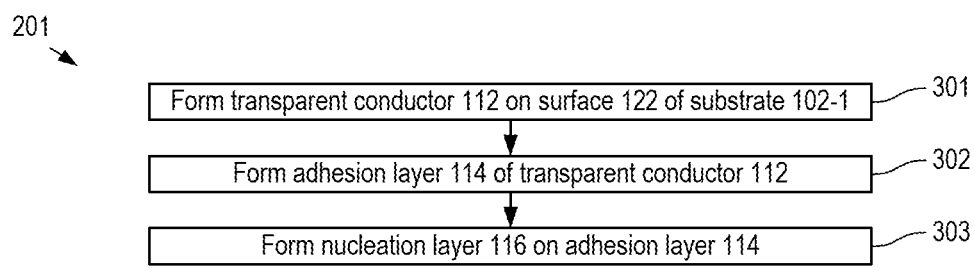
FIG. 3 depicts sub-operations suitable for forming window electrode 104 as part of operation 201.

FIG. 3 depicts sub-operations suitable for forming window electrode 104 as part of operation 201. Operation 201 begins with sub-operation 301, wherein transparent conductor 112 is formed on surface 122 of substrate 102-1 in conventional fashion (e.g., evaporation, sputtering, etc.).

In the depicted example, transparent conductor 112 is a layer of indium tin oxide (ITO) disposed on the entire interior surface of substrate 102-1. In some embodiments, transparent conductor 112 comprises a transparent conducting material other than ITO, such as a different conducting oxide (e.g., fluorine-doped tin oxide (FTO), doped zinc oxide (ZnO), etc.), a conducting polymer (e.g., poly(3,4-ethylenedioxythiophene) (PEDOT), Poly(4,4-dioctyl cyclopentadithiophene), etc.), carbon nanotubes, and the like.

At sub-operation 302, adhesion layer 114 is formed on transparent conductor 112.

Adhesion layer 114 is a layer that is configured to anchor nucleation layer 116 to the transparent conductor. In other words, adhesion layer 114 facilitates bonding nucleation layer 116 and transparent conductor 112. In some embodiments, adhesion layer forms covalent bonds with the material of at least one of these layers.

It should be noted that the transmissivity of window electrode 104 is intimately related to the morphology of the metal layer that electrodeposits on the window electrode surface. For a completely uniform compact metal film, for example, the Beer-Lambert law indicates that the transmission of an electrode will exponentially decrease with respect to the thickness of metal electrodeposited. It is known in the prior art that a nucleation layer comprising platinum nanoparticles can improve the quality of electrodeposition on the surface of a transparent electrode. U.S. Pat. No. 6,552,843, for example, describes a transparent electrode having a surface modification layer comprising a noble metal (e.g., platinum, iridium, gold, osmium, etc.) formed on a transparent electrode while also employing an underlayer of another metal to improve adhesion of the surface modification layer.

Unfortunately, in the prior art, the formation of an adhesion layer typically requires deposition in a vacuum chamber, which is a slow, expensive process step. Thickness control an also be challenging, potentially giving rise to variations in the transmissivity of a resultant dynamic glass elements from run to run.

It is an aspect of the present disclosure, however, that a non-metallic adhesion layer can be used to improve adhesion of a nucleation layer on a transparent electrode in a less costly, less complex, and highly repeatable manner. As a result, embodiments in accordance with the present disclosure enable better performance of dynamic glass elements than can be achieved in the prior art. Furthermore, while not required, the use of a self-assembled monolayer-based adhesion layer ensures repeatable thicknesses from run to run, thereby affording embodiments in accordance with the present disclosure with additional significant advantages over prior-art dynamic glasses.

To form adhesion layer 114, substrate 102-1 is immersed in solution 402, which enables the adhesion layer to form on transparent conductor 112.

Solution 402 is an ethanolic solution of 10 mM 3-mercaptopropionic acid. Substrate 102-1 immersed in solution 402 for 24 hours, followed by rinsing it in ethanol and water. In some embodiments, adhesion layer 114 is formed via another wet-processing method, such as spray coating, spin coating, and the like.

The resulting adhesion layer (i.e., adhesion layer 112) is an organic self-assembled monolayer (SAM) comprising 3-mercaptopropionic acid. Other materials suitable for use in adhesion layer 112 include, without limitation, non-metallic self-assembled monolayers, mercapto-organic acids, cyanic acids, silanes, thiols, phosphoric acid, phosphonic acids, amino acids, and the like.

Figure 4A:
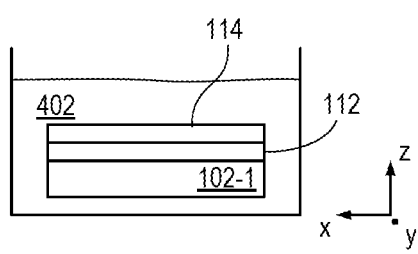
FIG. 4A depicts the formation of adhesion layer 114 in solution 402.

FIG. 4A depicts the formation of adhesion layer 114 in solution 402.

Figure 5:
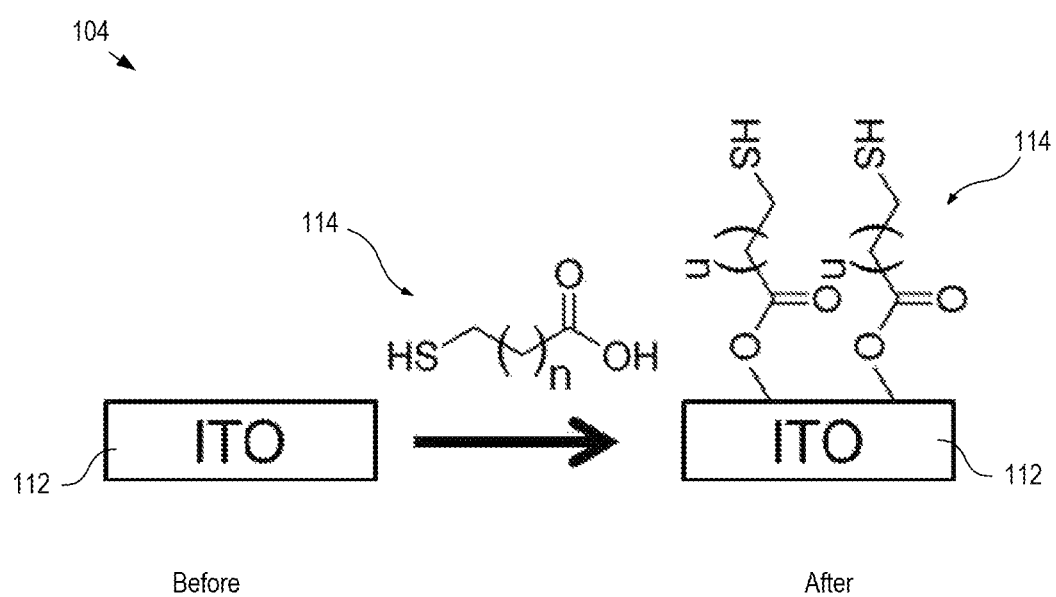
FIG. 5 depicts a representation of window electrode 104 before and after formation of adhesion layer 114.

FIG. 5 depicts a representation of window electrode 104 before and after formation of adhesion layer 114.

At sub-operation 303, nucleation layer 116 is formed on adhesion layer 114 to complete the formation of window electrode 104. In the depicted example, nucleation layer 116 is formed by immersing substrate 102-1 in solution 404, which is an aqueous solution containing nanoparticles comprising a noble metal (e.g., platinum, palladium, gold, etc.) or an electrochemically stable material (e.g., carbon, etc.). In the depicted example, solution 404 includes 3-nm diameter platinum nanoparticles. To form adhesion layer 114, the substrate is immersed in solution 404 for 72 hours, then rinsed with water and dried in nitrogen. In some embodiments, solution 404 includes nanoparticles having a diameter other than 3 nm.

Figure 4B:
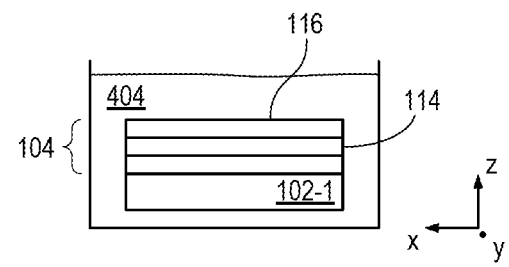
FIG. 4B depicts the formation of nucleation layer 116 in solution 404.

FIG. 4B depicts the formation of nucleation layer 116 in solution 404.

One skilled in the art will recognize, after reading this Specification, that the sub-operations described herein for operation 201 are merely exemplary and that many alternative/additional operations can be employed without departing from the scope of the present disclosure. For example, operation 201 can include additional sub-operations, such as annealing, to reduce the immersion time required to form nucleation layer 116, alternative materials and/or solutions can be used operation 302 (e.g., the concentration of 3-mercaptopropionic acid used in solution 402 can be other than 10 mM, SAM solutions other than 3-mercaptopropionic acid can be used, etc.), the nanoparticles included in solution 404 can have sizes other than 3 nm and/or include materials other than platinum, and the like.

Returning now to method 200, at operation 202, counter electrode 106 is formed on surface 124 of substrate 102-2.

Substrate 102-2 is analogous to substrate 102-1. It should be noted that, although the illustrative embodiments includes substrates that are made of glass, at least one of substrates 102-1 and 102-2 can comprise a different material without departing from the scope of the present disclosure. For example, in some embodiments, at one of substrates 102-1 and 102-2 comprises a material that is transparent for electromagnetic radiation having a wavelength other than that of the visible-light spectrum. In some embodiments, one of substrates 102-1 and 102-2 is substantially opaque for the desired electromagnetic radiation spectrum. In some embodiments, at least one of substrates 102-1 and 102-2 comprises a material other than glass, such as a plastic, semiconductor, metal, ceramic, composite material, and the like.

In the depicted example, counter electrode 106 is an annulus of electrical conductor disposed around the square perimeter of substrate 102-2 such that the counter electrode is in contact with electrolyte 108 when window 100 is fully assembled. In some embodiments, counter electrode 106 has a shape other than a square, such as a rectangle, circle, ellipse, irregular shape, and the like. In some embodiments, counter electrode 106 is a transparent conducting electrode. In some embodiments, counter electrode 106 comprises a grid or matrix of small-linewidth traces (e.g., a fine mesh or grid, etc.).

Figure 4C:
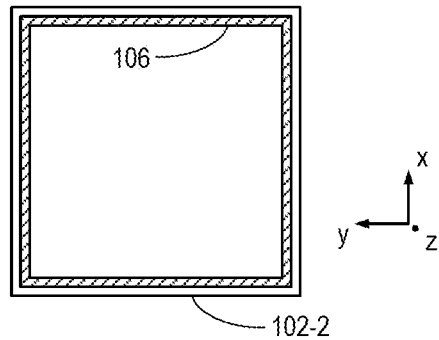
FIG. 4C shows counter electrode 106 disposed on substrate 102-2.

FIG. 4C shows counter electrode 106 disposed on substrate 102-2.

At operation 203, substrates 102-1 and 102-2 are mounted in frame 126 such that window electrode 104 and counter electrode 106 are separated by gap g having separation s along the z direction. Frame 126 is a conventional mechanically rigid annulus of structural material suitable for holding the substrates in a fixed relationship with one another. At operation 203, frame 126 is not completely sealed to enable the introduction of electrolyte 108 into gap g. In some embodiments, frame 126 is a flexible frame comprising an elastomer, such as rubber, silicone, etc.

Figure 4D:
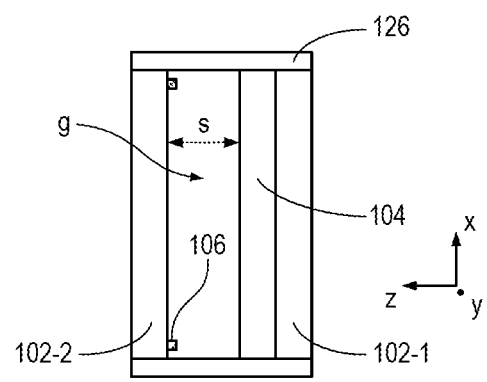
FIG. 4D shows substrates 102-1 and 102-2 in their final configuration, in which window electrode 104 and counter-electrode 106 are separated by gap g, having a separation distance of s.

FIG. 4D shows substrates 102-1 and 102-2 in their final configuration, in which window electrode 104 and counter-electrode 106 are separated by gap g, having a separation distance of s.

At operation 204, electrolyte 108 is introduced into gap g.

Electrolyte 108 is an aqueous solution containing ions of metal 110. In the depicted example, electrolyte 108 comprises $Pb(ClO_4)_2$, $CuCl_2$, $Cu(ClO_4)_2$, and $LiClO_4$. $Pb(ClO_4)_2$ serves as a source of $Pb^{2+}$ charge balanced by the non-coordinating $ClO_4^-$ anion. The electrolyte contains both $CuCl_2$ and $Cu(ClO_4)_2$ as sources of $Cu^{2+}$. The $CuCl_2$ serves as a source of $Cl^-$, which is a Cu electrodeposition and stripping accelerant. It should be noted, however, that the low solubility of $PbCl_2$ reduces the concentration of $Cl^-$ in solutions containing $Pb^{2+}$. As a result, $Cu(ClO_4)_2$ is included in the electrolyte to serve as an additional source of $Cu^{2+}$, which shifts the speciation of $Cl^-$ in the electrolyte to favor the formation of soluble Cu—Cl complexes such as $CuCl_4^{2-}$ due to Le Châtelier's principle. A high concentration of $LiClO_4$ is included to serve as a supporting electrolyte to increase the ionic conductivity of the solution. In some embodiments, a different electrolyte is used, such as a gold/copper electrolyte, a silver/copper electrolyte, a bismuth/copper electrolyte, and the like. In some embodiments, electrolyte 108 is a non-aqueous electrolyte.

In the depicted example, metal 110 comprises lead and copper; however, one skilled in the art will recognize, after reading this Specification, that myriad metals can be included in metal 110, alone or in combination.

In some embodiments, electrolyte 108 includes one or more additives for increasing its viscosity to form a gel electrolyte. In some embodiments, electrolyte 108 includes a polymer gel that can be hardened by inducing it to cross-link (e.g., via exposure to ultraviolet energy, microwaves, etc.).

At operation 205, frame 126 is sealed to trap electrolyte 108 inside window 100.

In operation, conventional voltage source 118 applies a negative voltage potential applied to window electrode 104, relative to counter electrode 106, which gives rise to reduction of the metal ions in electrolyte 108 and electrodeposition of metal 110 on the surface of the window electrode. As the surface of the window electrode becomes coated with metal 110, its transmission decreases according to the thickness of the growing metal layer.

To increase the transmissivity of window 100, metal 110 is stripped from window electrode by reversing the polarity of the voltage potential applied between window electrode 104 and counter electrode 106.

Figure 6A:
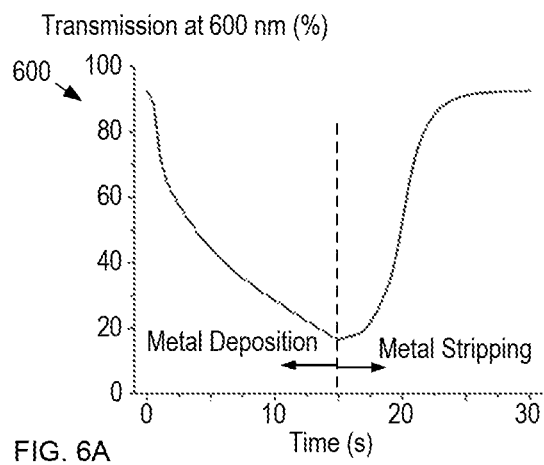
FIGS. 6A-C show plots of transmission through a window in accordance with the present disclosure.
Figure 6B:
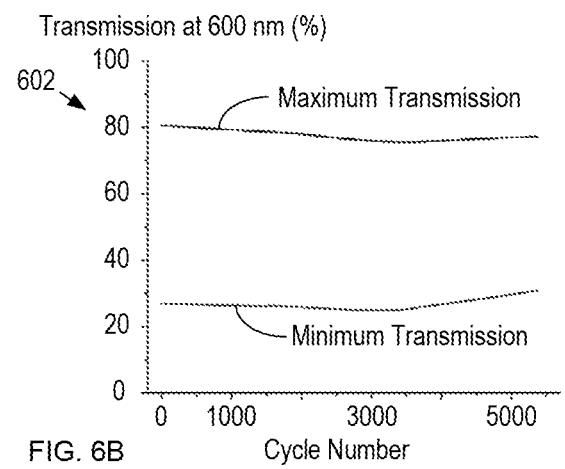
Figure 6C:
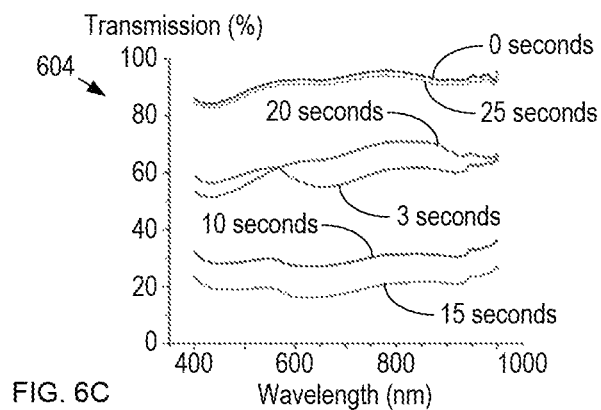

FIGS. 6A-C show plots of transmission through a window in accordance with the present disclosure.

Plot 600 shows transmission of light having a wavelength of 600 nm through a spectroelectrochemical cell that includes a platinum-modified ITO electrode disposed on a conventional glass substrate over one complete cycle of metal deposition and metal stripping. The cell includes an aqueous electrolyte containing 100 mM $Pb(ClO_4)_2$, 50 mM $CuCl_2$, 50 mM $Cu(ClO_4)_2$, and 1 M $LiClO_4$.

The metal deposition phase of the cycle corresponds to the application of a voltage bias of −0.55 V for 15 seconds. After 15 seconds, the voltage bias is switched to +0.65 V for the next 15 seconds, which results in metal stripping. As seen from plot 600, transmission through the cell is a function of the amount of metal deposited on the electrode and ranges between a maximum transmission of approximately 92% to a minimum transmission (for a 15 second deposition sequence) of approximately 20%.

Plot 602 shows the maximum and minimum transmission levels as the window is repeatedly cycled between its transparent and opaque states. The data shown in the plot is acquired for thousands of cycles in which the window is provided a bias potential of −0.35 V for 60 seconds to induce metal deposition followed by a bias potential of +0.45 V for 60 seconds to induce metal dissolution. The maximum and minimum transmissivity states have a contrast ratio of approximately 50% over the course of 1000 cycles.

It should be noted that both the deposition voltage applied as well as the deposition time can be increased to achieve higher contrast ratios. For example, by applying a deposition voltage of −0.55 V, contrast ratios greater than 60% can be realized, while a deposition voltage of −0.75 V has been shown to give rise to contrast ratios greater than 90% with a transition time of only 10 seconds. Higher bias voltages can have negative ramifications on window reliability, however.

Plot 604 shows the transmission versus wavelength for the window at different times in the activation cycle shown in plot 600. Plot 604 demonstrates that the transmission through the window is substantially spectrally flat throughout the complete activation cycle.

It is an aspect of the present disclosure that the use of a platinum-modified window electrode affords embodiments in accordance with the present disclosure with additional advantages over the prior art specifically, dynamic-glass-based windows having platinum-modified window electrodes exhibit greatly improved cycling capability as compared to windows having non-platinum-modified window electrodes.

FIGS. 7A-B depict maximum and minimum transmissions for dynamic-glass-based windows having platinum-modified and non-platinum-modified window electrodes, respectively.

Plot 700 shows that the minimum and maximum transmission levels remain substantially constant over 1000 cycles for the window having a platinum-modified window electrode, while plot 702 demonstrates that the opacity of a window without a platinum-modified window electrode steadily degrades with each additional activation cycle it undergoes.

Unfortunately, as the size of a dynamic glass element increases, it becomes more difficult to obtain a uniform voltage drop across the area of the device due to a voltage drop than manifests due to the need to pass current through its large-area window electrode. This gives rise to significantly non-uniform transmission characteristics over the area of the window, particularly during the color change process. Furthermore, these uniformity issues are typically exacerbated as the number of transition cycles increases. Still further, prior-art dynamic-glass-based windows normally require high deposition voltages, which leads to rough, porous deposits that are difficult to electrochemically dissolve during subsequent stripping operations.

Figure 8:
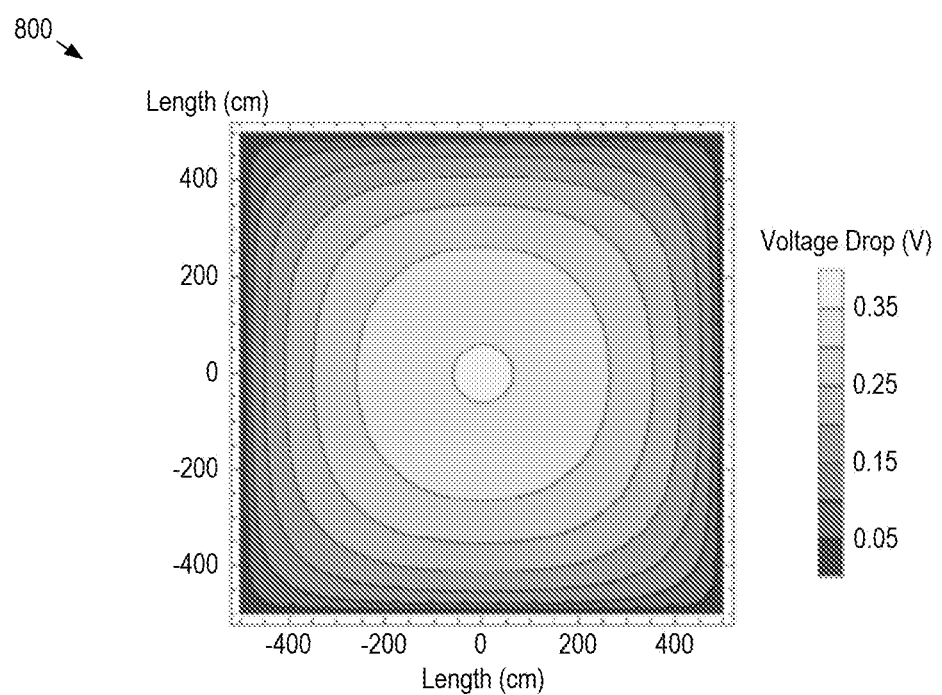
FIG. 8 depicts a simulation of a voltage drop across a dynamic-glass-based window.

FIG. 8 depicts a simulation of a voltage drop across a dynamic-glass-based window. Plot 800 shows the voltage drop variation over the area of a square dynamic-glass-based window having side length of 1 meter in each of the x- and y-directions. The voltage drop depicted in plot 800 is derived using the following equation:

$$\Delta V = \frac{J\rho}{t}\sqrt{\left(\frac{L^2-x^2}{2}\right)\left(\frac{L^2-y^2}{2}\right)}$$

where J is the plating current density (assumed to be constant), p is the resistivity of the window electrode, L is the side length of the window, and x and y are the distances along the x- and y-directions from the center of the window.

It is clear from the plot that a significant non-uniformity of voltage drop exists across the diameter of the window, with the voltage drop in the center being seven times greater than the voltage at the perimeter of the window.

It is an aspect of the present disclosure that the aggregate uniformity of a dynamic glass element can be improved by employing a window electrode that comprises a plurality of smaller window electrodes, each electrically coupled with voltage source 118 via a high-conductivity trace. By employing a "grid-like" window electrode, therefore, such windows in accordance with the present disclosure exhibit reduced irising and require lower deposition voltages.

Figure 9A:
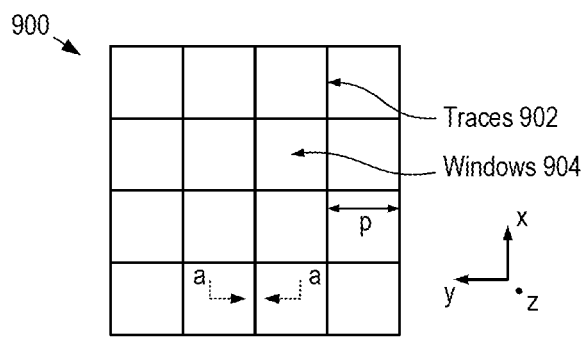
FIGS. 9A-B depict schematic drawings of top and cross-sectional views of an augmented transparent conductor of a window electrode in accordance with an alternative embodiment in accordance with the present disclosure.
Figure 9B:
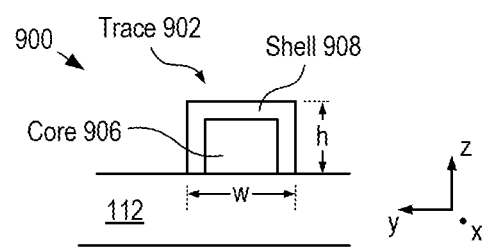

FIGS. 9A-B depict schematic drawings of top and cross-sectional views of an augmented transparent conductor of a window electrode in accordance with an alternative embodiment in accordance with the present disclosure. Window electrode 900 includes traces 902, which are electrically connected with transparent conductor 112 to collectively define windows 904. The view shown in FIG. 9B is taken through line a-a as shown in FIG. 9A.

Each of traces 902 includes a core of high-electrical-conductivity material that is surrounded by a shell of substantially chemically inert material that acts to protect the core from exposure to electrolyte 108. In the depicted example, core 906 comprises copper having a thickness of approximately 9 microns and shell 908 comprises platinum having a thickness of approximately 1 micron; however, one skilled in the art will recognize, after reading this Specification, that other materials and/or thicknesses can be used. Materials suitable for use in core 906 include, without limitation, gold, nickel, aluminum, silver, and the like. Materials suitable for use in shell 908 include noble metals (e.g., platinum, gold, iridium, silver, palladium, etc.), inert conductors and semiconductors (e.g., titanium nitride, etc.), composite materials, and the like. In some embodiments, traces 902 include an outer layer comprising metal 110, where this outer layer acts as a metal source for electrodeposition.

A preferred range of dimensions for traces 902 (i.e., width, w, height, h, and pitch, p) is based on competing goals of low resistivity and high transmissivity. Sheet resistance of a grid-augmented window electrode is inversely linearly proportional to pitch and resistivity, but increases as the square of gridline width. Typically, the width, w, and height, h, of each trace 902 is within the range of approximately 5 microns to approximately 100 microns and, preferably, less than or equal to 10 microns so that they are substantially invisible to the naked eye, while a pitch, p, within the range of approximately 50 microns to approximately 1 mm provides sufficiently small sheet resistance. In the depicted example, traces 902 have both width and height of 10 microns and are arranged with a uniform pitch of 250 microns.

In some embodiments, traces 902 can be several meters in length; therefore, the low-resistivity of core 906 serves to transport charge to each window 904 from the edge of window electrode 900 in substantially equal fashion. As a result, current can flow to the center of the dynamic-glass element with much lower voltage drop than prior-art transparent electrodes. Forming window electrode 104 as an array of windows 904, therefore, enables faster operation of a dynamic-glass element, operation at lower voltage, and more uniform transitioning of the element between its transmissive and non-transmissive states.

It should be noted that, although the traces of window electrode 900 are arranged in a regular orthogonal arrangement, traces 902 can be arranged in any practical manner, such as hexagonally close packed, triangular, irregularly (with an average pitch between traces), and the like.

Once traces 902 are formed on transparent conductor 112, adhesion layer 114 and nucleation layer 116 are formed as described above.

Figure 9C:
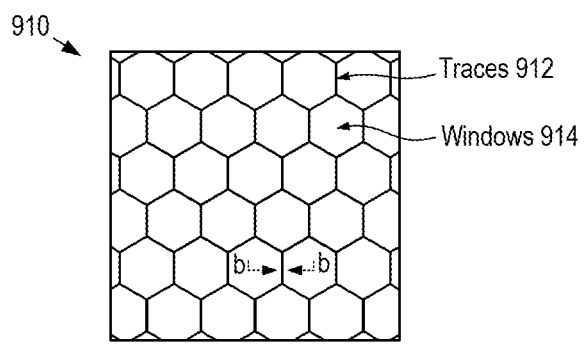
FIGS. 9C-D depict schematic drawings of top and cross-sectional views of another configuration of an augmented transparent conductor of a window electrode in accordance with the alternative embodiment in accordance with the present disclosure.
Figure 9D:
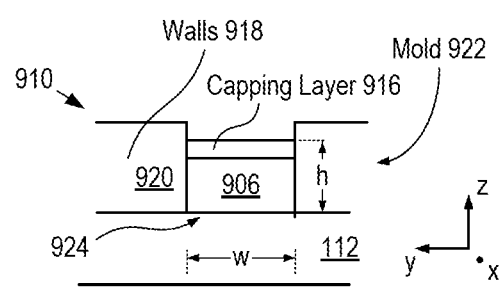

FIGS. 9C-D depict schematic drawings of top and cross-sectional views of another configuration of an augmented transparent conductor of a window electrode in accordance with the alternative embodiment in accordance with the present disclosure. Window electrode 910 includes traces 912, which are electrically connected with transparent conductor 112 to collectively define hexagonally shaped windows 914. The view shown in FIG. 9D is taken through line b-b as shown in FIG. 9C.

Trace 912 includes core 906 and capping layer 916. In the depicted example, capping layer 916 is a layer of platinum having a thickness of approximately 250 nm.

Walls 918 comprise material 920, which is preferably a material that is substantially transparent for light signal 120, is substantially color neutral, and is substantially chemically inert with respect to the constituent components of electrolyte 108 (e.g., water and acid). In the depicted example, walls 918 are defined from a photoresist layer having a thickness of approximately 20 microns, where the photoresist has a refractive index of approximately 1.56 at 600 nm and a very low absorption coefficient. It should be noted that this refractive index is well matched to the refractive index of the ITO (1.81) used in transparent conductor 112, which mitigates reflectivity and haze in the window electrode.

To fabricate traces 912, walls 918 are defined via conventional photolithography to expose the top surface of transparent conductor 112 in region 924, thus defining mold 922.

Once mold 922 is defined, successive electrodepositions are performed to form core 906 on regions 924 and capping layer 916 on the top surface of core 906.

It is to be understood that the disclosure teaches just some examples of the illustrative embodiment and that many variations of the invention can easily be devised by those skilled in the art after reading this disclosure and that the scope of the present invention is to be determined by the following claims.

What is claimed is:

1. A method for forming dynamic-glass element comprising a first electrode disposed on a first substrate, a second electrode disposed on a second substrate, and an electrolyte that is located between the first and second electrodes, wherein the first electrode comprises three layers comprising a transparent conductor layer, an adhesive layer and a nucleation layer, and is formed by operations of a method comprising:

enabling first contact between a first liquid and a first surface of a of the transparent conductor layer comprising a first material, the transparent conductor layer being disposed on the first substrate, wherein the first liquid comprises a non-metallic solution, wherein the first contact gives rise to the adhesion layer disposed on the first surface of the transparent conductor layer, the adhesion layer being non-metallic; and enabling second contact between the adhesion layer and a second liquid containing a plurality of nanoparticles comprising a second material, wherein the second contact gives rise to the nucleation layer disposed on the adhesion layer.

2. The method of claim 1, wherein the adhesion layer is formed as a self-assembled monolayer.

3. The method of claim 1, wherein the adhesion layer is formed as an organic self-assembled monolayer.

4. The method of claim 1, wherein the first liquid comprises a third material selected from the group consisting of thiols, silanes, phosphonic acids, mercapto-organic acids, cyanic acids, silanes, phosphoric acid, and amino acids.

5. The method of claim 1, wherein the second material is selected from the group consisting of noble metals, inert conductors and inert semiconductors.

6. The method of claim 1, wherein the second material comprises platinum.

7. The method of claim 1 further comprising:
forming a plurality of traces on the transparent conductor layer, at least one trace of the plurality thereof including a core comprising a third material and a shell comprising a fourth material, wherein the third material has an electrical conductivity that is higher than that of the first material, and wherein the shell is formed over the core in conformal fashion.

8. The method of claim 7, wherein the third material comprises copper and the fourth material comprises platinum.

9. The method of claim 7, wherein the shell is formed via atomic-layer deposition.

10. The method of claim 1 further comprising forming a plurality of traces on the transparent conductor layer, at least one trace of the plurality thereof being formed by operations comprising:
defining a mold that exposes the first surface in a first region;
forming a core on the first region, wherein the core includes a third material having an electrical conductivity that is higher than that of the first material; and
forming a capping layer that is disposed on the core, wherein the capping layer includes a fourth material that is substantially chemically inert with respect to the electrolyte.

* * * * *